(12) United States Patent
Halley

(10) Patent No.: US 6,885,206 B2
(45) Date of Patent: Apr. 26, 2005

(54) DEVICE FOR SUPPORTING THIN SEMICONDUCTOR WAFERS

(75) Inventor: David G. Halley, San Luis Obispo, CA (US)

(73) Assignee: Strasbaugh, San Luis Obispo, CA (US)

(*) Notice: Subject to any disclaimer, the term of this patent is extended or adjusted under 35 U.S.C. 154(b) by 0 days.

(21) Appl. No.: 10/365,081

(22) Filed: Feb. 11, 2003

(65) Prior Publication Data
US 2004/0155671 A1 Aug. 12, 2004

(51) Int. Cl.⁷ .................................................. G01R 1/04
(52) U.S. Cl. ...................................... 324/755; 324/765
(58) Field of Search ........................... 324/158.1, 73.1, 324/755, 754, 765; 269/21, 233; 279/3, 4.04

(56) References Cited

U.S. PATENT DOCUMENTS

| | | | | |
|---|---|---|---|---|
| 3,729,206 A | * | 4/1973 | Cachon et al. ................ | 279/3 |
| 3,990,689 A | * | 11/1976 | Eklund, Sr. ................... | 269/21 |
| 4,037,830 A | * | 7/1977 | Poluzzi et al. ................. | 269/21 |
| 4,131,267 A | * | 12/1978 | Ono et al. ..................... | 269/21 |
| 4,182,265 A | | 1/1980 | Bracher ........................ | 118/500 |
| 5,133,140 A | | 7/1992 | Frey ............................ | 38/102.91 |
| 5,703,493 A | * | 12/1997 | Weeks et al. ................. | 324/755 |
| 5,707,051 A | * | 1/1998 | Tsuji ............................ | 269/21 |
| 5,794,372 A | | 8/1998 | Grana .......................... | 40/729 |
| 6,187,134 B1 | | 2/2001 | Chow et al. .................. | 156/345 |
| 6,317,647 B1 | * | 11/2001 | Akaike et al. ................ | 700/213 |
| 6,379,235 B1 | | 4/2002 | Halley ......................... | 451/397 |
| 6,454,865 B1 | | 9/2002 | Goodman et al. ............ | 118/728 |

OTHER PUBLICATIONS

Hurley et al., *The Dynamics of Backside Wafer–Level Emission Microscopy*, Electronics Engineer, Jan. 1998.

* cited by examiner

Primary Examiner—Vinh P. Nguyen
(74) Attorney, Agent, or Firm—K. David Crockett; Crockett & Crockett

(57) ABSTRACT

A device for supporting and securing thin wafers comprising a housing having an upper shelf extending radially inwardly from the housing and a lower shelf extending radially inwardly from the upper shelf. An upper seal is disposed within the upper shelf and an inspection windowpane is disposed within the lower shelf. A vacuum is provided between the inspection windowpane and the upper seal to secure the wafer to the inspection windowpane and to secure the inspection windowpane to the housing. A ring-shaped frame assembly may further support and secure the wafer.

4 Claims, 3 Drawing Sheets

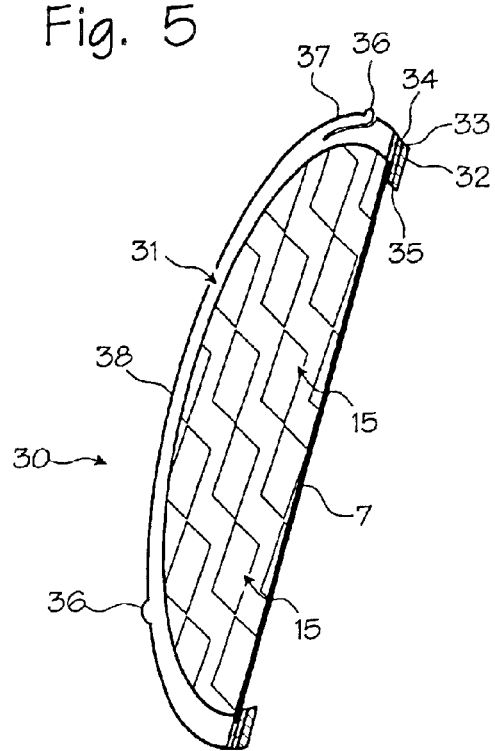
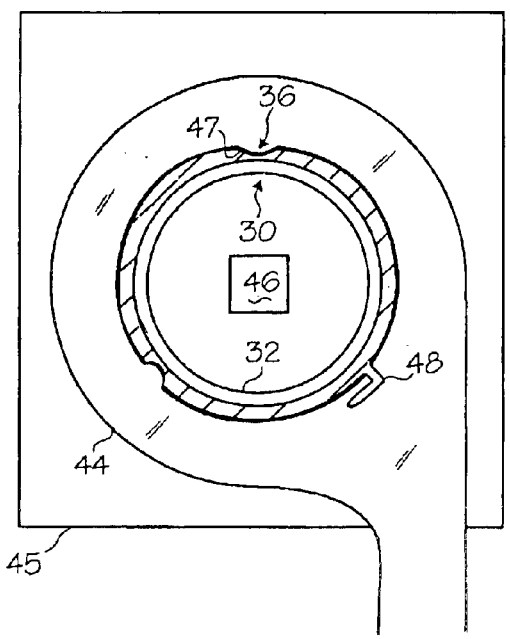
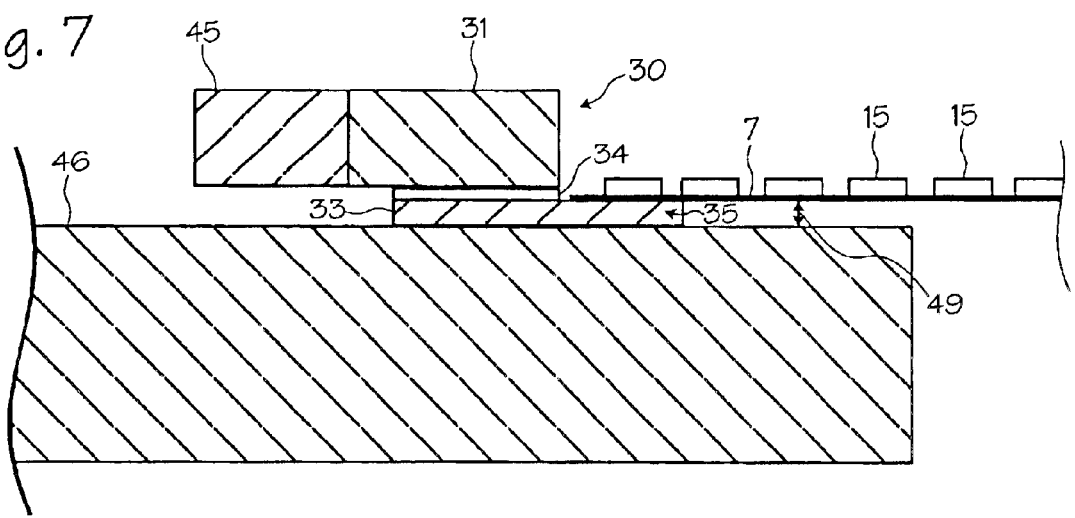

DEVICE FOR SUPPORTING THIN SEMICONDUCTOR WAFERS

FIELD OF THE INVENTIONS

The inventions described below relate the field of systems for supporting fragile materials, and in particular to systems for supporting semiconductor wafers thinned for conducting failure analysis of integrated circuits disposed on the wafers.

BACKGROUND OF THE INVENTIONS

During and following integrated circuit chip manufacturing processes, integrated circuits are inspected to detect defects. The process by which the defects are detected is known as failure analysis. Failure analysis may be accomplished by a wide array of techniques. One technique used to perform failure analysis is to physically test one chip at a time with a probe. The probe provides power to the circuit. The resistive heating of the circuit elements can then be characterized, the difference between good (intended) and bad (unintended) circuits can be detected and problems isolated. However, since many chips may be built-up on a wafer, the process of performing failure analysis on one chip at a time is slow. A technique employed to improve the speed of failure analysis is emission microscopy. Most chip-level defects emit light at particular wavelengths when stimulated by a light source or an electric current, and the emitted light may be quickly collected and analyzed to detect defects. Thus, emission microscopy is an efficient way to detect defects in integrated circuits.

However, the total number of integrated circuit layers built-up on chips has been greatly increasing. Indeed, many chips now comprise so many layers that the light emitted by a defect may never escape from the chip layers if the wafer substrate is too thick. (Other failure analysis techniques, such as thermal analysis, also suffer difficulties because of the large number of layers built up on the wafer.) One solution to this problem has been to grind the backside of the wafer to make the wafer extremely thin, as thin as 50 micrometers (50 microns or 50 µm). Once the wafer is thinned, light emitted from defects in the layers can escape through the backside of the wafer and then be analyzed. Failure analysis using this technique is known as backside emission microscopy.

To increase production efficiency, failure analysis may be performed on an entire wafer containing many chips, as opposed to cutting the wafer into separate chips and analyzing each chip one at a time. However, since the backside of the wafer is extremely thin, the entire wafer is frangible and the circuits built up on the wafer can be easily damaged or broken during failure analysis. The problem is complicated by the fact that chip manufacturers desire to build up chips on wafers of the largest diameter. Larger diameter wafers require more support than smaller diameter wafers.

The problem of thin wafer breakage is further complicated by the fact that physical force may be applied to the wafer during and after failure analysis. For example, a probe may be applied to the front side of the wafer during backside emission microscopy. If the probe applies physical force to the wafer, and if the wafer is not adequately supported, then the wafer or the circuits built on the wafer may be damaged. Thus, wafers need support during failure analysis to avoid unnecessary damage to wafers and to the chips built-up on them.

One support technique that has been used during failure analysis is to glue the wafer to a rigid optical windowpane using an optical adhesive. Backside emission microscopy is then conducted through the window pane. A problem with gluing the wafer to the windowpane is that in many techniques the glue is not removable, thereby permanently and undesirably attaching the windowpane to the wafer. Even if the glue is removable, the process of removing the wafer from the windowpane sometimes damages the wafer. Thus, improved devices and methods are needed to support thin wafers (wafers of a thickness below about 250 µm) during failure analysis.

Devices have been proposed to support thin wafers during other wafer or chip manufacturing steps. For example, Goodman et al., Low Mass Wafer Support System, U.S. Pat. No. 6,454,865 (Sep. 24, 2002) shows a wafer support ring for use in high temperature ovens. A first shelf extends from the inside diameter of the support ring and a second shelf extends from the first shelf. A passage in the support ring allows gas to flow between a wafer, which rests on the first shelf, and a base plate, which rests on the second shelf. Bracher, Wafer Support, U.S. Pat. No. 4,182,265 (Jan. 8, 1980) also shows a holding ring for supporting the edge of a wafer.

SUMMARY

The methods and devices described below provide for a means for supporting thin wafers. A wafer support assembly holds a wafer on an inspection windowpane by applying a vacuum between the inspection windowpane and a seal disposed above the wafer. The inspection windowpane and the seal are disposed within an annular housing. The annular housing comprises a non-resilient housing adapted to receive the inspection windowpane, the wafer and the seal. When a vacuum is provided through a channel in the housing, the vacuum causes the seal to hold the wafer to the inspection windowpane. The wafer is thus supported without the use of adhesives. The housing may be removably attached to a means for performing failure analysis.

The wafer may be further supported by a frame assembly. The frame assembly comprises an annular frame and an annular wafer platform attached to the frame with an adhesive layer. The wafer platform has an inner diameter smaller than that of the frame so that a wafer may be disposed on top of the wafer platform. The adhesive layer may extend across the width of the surface of the platform so that the adhesive secures the wafer to the platform. On the other hand, the wafer may rest on the platform without using an adhesive. In either case, the entire assembly may be moved by moving the wafer frame. The frame assembly may be disposed on the inspection windowpane of the housing. The frame assembly or housing, together or individually, may be removably attached to a means for performing failure analysis.

BRIEF DESCRIPTION OF THE DRAWINGS

FIG. 5 shows a cut-away view of a frame assembly for holding a wafer.

FIG. 6 shows an embodiment of a frame assembly disposed within a wafer positioner that is itself disposed over an inspection table.

FIG. 7 shows a cross section of an embodiment of the frame assembly disposed over an inspection table.

DETAILED DESCRIPTION OF THE INVENTIONS

Figure 1:
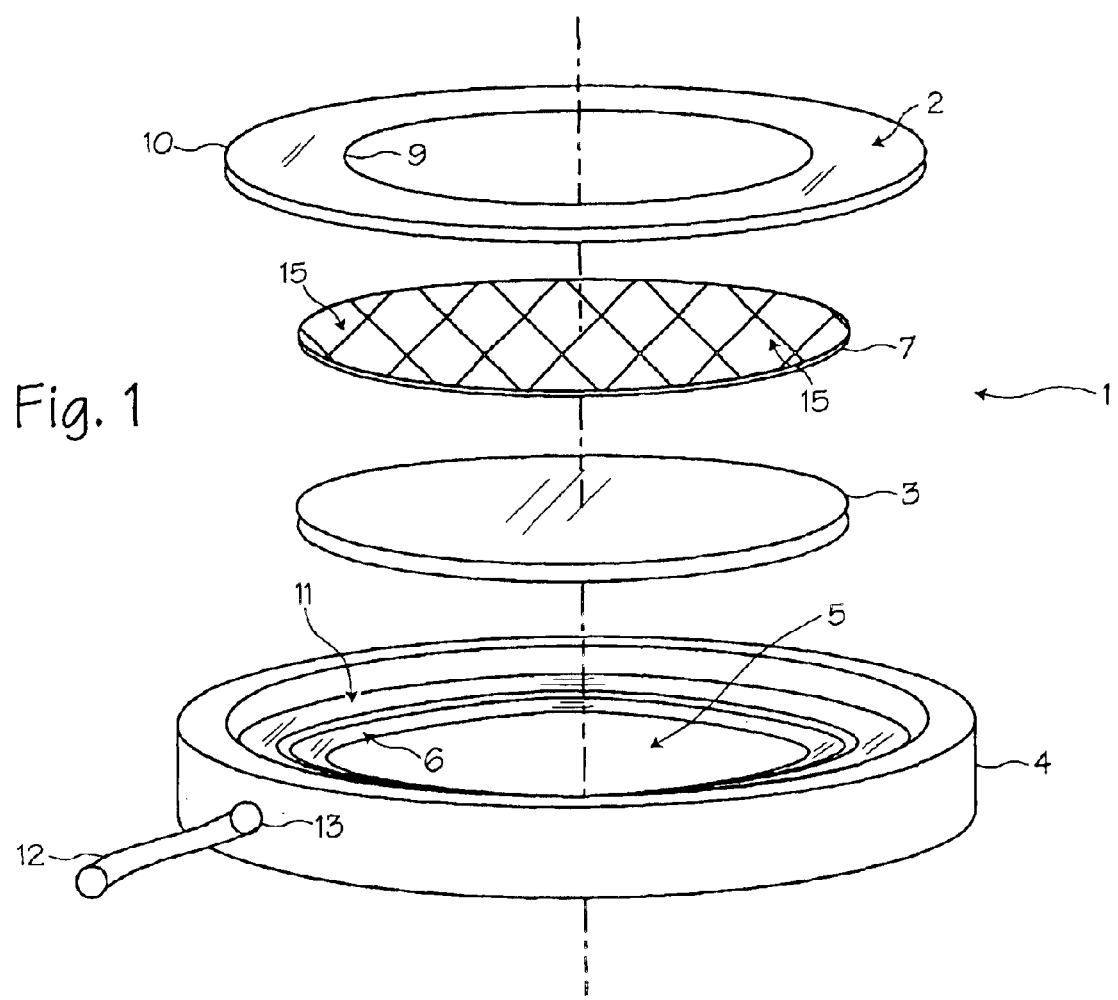
FIG. 1 shows an exploded view of a wafer support assembly.

FIG. 1 shows an exploded view of a wafer support assembly 1. The wafer support assembly comprises an annular gasket or upper seal 2, a glass plate or inspection windowpane 3 disposed beneath the upper seal and an annular frame or housing 4 adapted to receive the upper seal and inspection windowpane. The central portion 5 of the housing may be hollow to allow failure analysis equipment physical access to the inspection windowpane. In other embodiments the inspection windowpane may be an integral part of the housing and will occupy the central portion 5 of the housing. The inspection windowpane may also be provided with one or more openings to accommodate equipment used during failure analysis or equipment used during other wafer processing techniques. (Failure analysis equipment may include a physical probe, equipment used in backside emission microscopy, electrical probes, and other equipment used during failure analysis).

Figure 2:
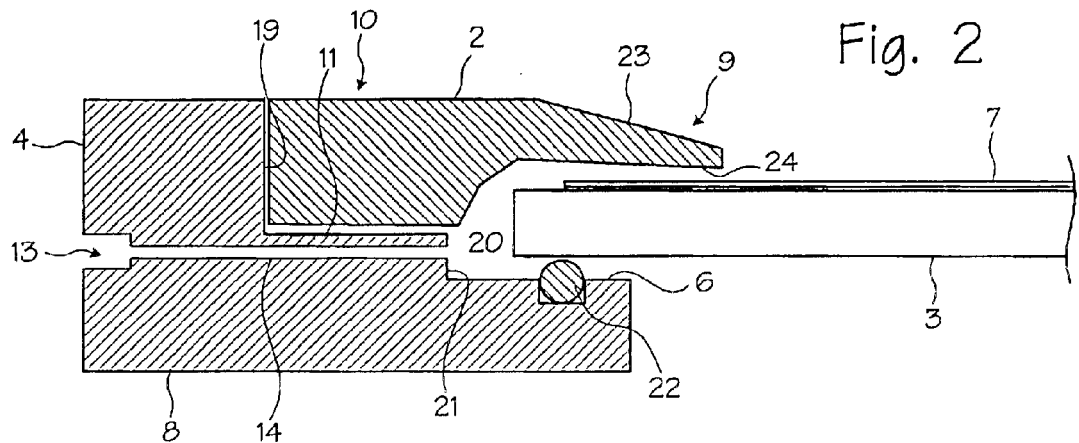
FIG. 2 shows a cross section of the wafer support assembly of FIG. 1.

When the wafer support assembly 1 is assembled for use, the inspection windowpane 3 rests on a lower annular lip, step, shoulder, seat or shelf 6 of the housing 4. The inspection windowpane also rests on an O-ring or ring seal disposed within the lower shelf, as shown in FIG. 2. The shelf extends radially inwardly from and is integral with the housing. The shelves or platforms shown in this figure and the following figures may be formed through the layered assembly of rings having suitably varying inner diameter, or by one or more rabbets cut into the inner diameter of a ring, or by injection molding of the assembly with a preformed rabbeted inner diameter. The wafer 7 rests on the inspection windowpane. The height of the inspection windowpane and wafer may be equal to or greater than the height of the inner wall of the lower shelf, but less than the height of the inner wall of the upper shelf. (Heights are measured from the lower surface 8 of the housing, as shown in FIG. 2). The inner diameter, finger or inwardly extending flange 9, which comprises a resilient material, of the upper seal extends over and rests on the inspection windowpane and the wafer. The outer diameter 10 of the upper seal rests on an upper annular lip, step, seat, shoulder or shelf 11 of the housing. The upper shelf extends radially-inwardly from and is integral with the housing 4, and is also disposed above the lower annular shelf. The upper shelf also extends radially inwardly less than does the lower shelf. Thus, the upper shelf extends radially inwardly from the housing and the lower shelf may be thought of as extending radially inwardly from the upper shelf.

A tube 12 operably connects a vacuum source to a vacuum port 13 disposed within the housing. The vacuum port provides fluid communication from the vacuum source (which may be disposed outside the housing) through a channel 14, shown in FIG. 2, to a space between the inspection windowpane and the upper seal. When a vacuum is applied to the space, the upper seal 2 is drawn on the wafer 7, thus holding the wafer in place on the inspection windowpane 3. The inspection windowpane is itself pulled onto the lower shelf of the housing.

Once the wafer is supported, any desired process may be performed on the wafer or on the integrated circuit die or chips 15, such as failure analysis, dissection, repair, grinding, polishing or planarizing. The housing may be further designed to fit, removably or permanently, within any device that performs these processes.

FIG. 2 shows a cross section of the wafer support assembly of FIG. 1. The inspection windowpane 3 rests on the lower annular shelf 6 of the housing 4 and the wafer 7 rests on the inspection windowpane 3. In turn, the flange 9 of the upper seal rests on the wafer and inspection windowpane. The outer diameter 10 of the upper seal rests on the upper annular shelf 11, but does not physically contact the inspection windowpane or wafer. Thus, the upper seal rests on the upper shelf and extends over the wafer and inspection windowpane. The upper seal may fit snugly against the inner wall 19 of the upper shelf to further secure the assembly.

The upper seal 2 is sized and dimensioned such that an annular space 20 remains between the housing, the upper seal and the inspection windowpane. The vacuum port 13 provides fluid communication from the vacuum source, through the channel 14, through the inner wall 21 of the lower shelf and to the space 20 between the inspection windowpane and the upper seal. (The vacuum port and channel may be disposed anywhere within the housing and even in the upper seal, so long as a vacuum may be communicated to the space between the inspection windowpane and upper seal.) When a vacuum is provided to the space 20, the flange of the upper seal is pulled down on the wafer and inspection windowpane, thus securing the wafer to the inspection windowpane. Thus, no adhesive is needed to secure the wafer to the inspection windowpane. At the same time, the inspection windowpane pushes down on the O-ring or ring seal 22, thus maintaining the vacuum between the upper seal and the inspection windowpane.

Figure 3:
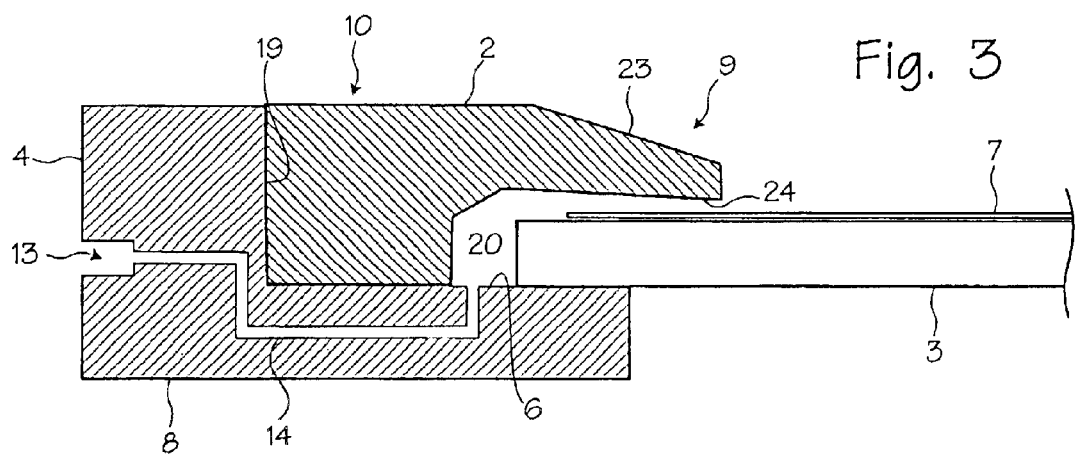
FIG. 3 shows a cross section of another wafer support assembly.

As described, the upper seal 2 is sized and dimensioned to rest on the upper shelf 11, yet the inwardly extending flange 9 of the upper seal is sized and dimensioned to extend over the inspection windowpane 3 and wafer 7. Thus, the outer diameter 10 of the upper seal is thicker than the flange 9 when the height of the inspection windowpane and the wafer extends partially above the height of the upper shelf, as shown in FIG. 2. In another embodiment the height of the wafer and the inspection windowpane does not extend above the height of the lower shelf. In this embodiment the inner diameter of the upper seal (the section of the upper seal that comprises the flange 9 in FIG. 2) may have the same thickness as, or may be thicker than, the outer diameter of the upper seal. In addition, the cross section of the flange may have any shape suitable for holding the wafer to the inspection windowpane. For example, the cross section of the flange may have the shape of a finger, as shown in FIGS. 2 and 3. The upper surface 23 or the lower surface 24 of the seal's inner diameter may be beveled.

FIG. 3 shows a cross section of another wafer support assembly 1. The housing 4 is provided with only a single shelf 6 upon which rests the upper seal 2 and the inspection windowpane 3. The upper seal is sized and dimensioned such that the inwardly extending flange 9 of the upper seal is disposed over the wafer 7 and the inspection windowpane 3. The inspection windowpane may be formed integrally with the housing. (In which case the housing and the windowpane are formed together from a transparent material, such as glass or a transparent plastic. In this case, the housing may be coated to render it opaque.) The vacuum port 13 provides fluid communication from the vacuum source through the channel 14 to the space 20 between the upper seal and the inspection windowpane. When in use, the vacuum holds the upper seal to the wafer and inspection windowpane, thus securing the wafer without using an adhesive. The frame and upper seal, when assembled together, create a frame with an annular groove in the inner diameter of the frame, where the groove is sized to accommodate the edge of a wafer or work piece, and the groove may be evacuated through the vacuum port to collapse the upper seal flange onto the wafer and pull or draw it into secure contact with the wafer. While illustrated with a hard supporting shelve in the frame, either or both inwardly extending portions of the assembly (flange 9 or shelf 6) may be formed of a resilient material subject to collapse upon the work piece when the annular groove is evacuated. For use with work pieces in which the outer perimeter of the work piece is not valuable, the upper seal and flange can be formed integrally with the frame and shelf, and formed of a resilient material. In this case, the work-piece and windowpane can be inserted into the groove by resiliently deforming the flange or shelf, and allowing the flange or shelf to resiliently recover to its original shape, and thereafter apply vacuum to the groove to collapse the flange and groove onto the work piece.

Figure 4:
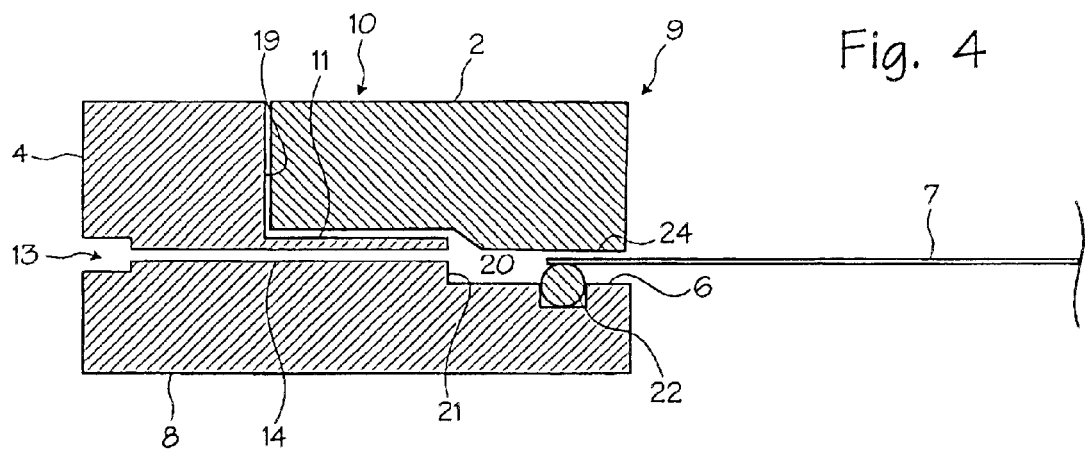
FIG. 4 shows a cross section of another wafer support assembly.

FIG. 4 shows a cross section of another wafer support assembly. In this embodiment the inspection windowpane is not present and the wafer 7 rests directly on the ring seal 22. In other embodiments the ring seal need not be present, in which case the wafer rests directly on the lower shelf. The inner diameter of the upper seal (the section of the upper seal that comprises the flange 9 in FIG. 2) rests directly on the wafer when a vacuum is applied. In this embodiment the inner diameter of the upper seal extends over the wafer and is shaped to closely overlie the wafer. The inner diameter 9 of the upper seal is thicker than the outer diameter 10 of the upper seal 2. The outer diameter of the upper seal rests on the upper annular shelf 11, but does not physically contact the wafer.

As in FIG. 2, the upper seal is sized and dimensioned such that a space 20 remains between the inner wall 21 of the shelf and the ring seal 22 or wafer 7 when the upper seal rests within the housing. The vacuum port 13 provides fluid communication from a vacuum source through the channel 14 to the space 20. When a vacuum is provided through the channel the upper seal is pulled down on the wafer and the wafer is pulled onto the ring seal, thus securing the wafer without the need for an adhesive. Because no inspection windowpane is present, both sides of the wafer may be physically accessed.

FIG. 5 shows a cut-away view of a holding ring or frame assembly 30 holding a wafer 7. A plurality of integrated circuit chips 15 are disposed on the front side of the wafer and may be readily accessed for failure analysis or processing. The frame assembly comprises a frame 31 and a wafer bed, flange, shoulder or platform 32 disposed beneath the frame. The frame and wafer platform each comprise an annular ring or washer. The cross section of the frame or platform may be any other solid shape, so long as the frame and the wafer platform are connected to each other and also so long as a wafer may rest securely on the wafer platform. The frame assembly may also comprise a single washer or ring having an inwardly extending flange, step or platform sized and dimensioned for holding a wafer on the platform, as in the previous figures.

The outer diameter 33 of the wafer platform is attached to the frame 31 with an adhesive layer 34, unless the wafer platform is an integral part of the frame. The wafer may rest on the adhesive layer 34, which extends across the surface of the outer diameter 33 and inner diameter 35 of the wafer platform 32. In other embodiments the wafer may freely rest on the wafer platform. In other words, the adhesive may not extend across the whole surface of the inner diameter 35 of the platform. Instead, the adhesive layer may only connect the platform to the frame.

One or more detents, projections, tabs, fiduciary bumps, fiduciary marks, indexing features or indexing bumps 36 may be disposed along the outer diameter of the frame to facilitate securing the frame to various devices for performing failure analysis, integrated circuit dissection or repair, wafer grinding, wafer polishing, wafer planarizing or other processes used in wafer and chip manufacturing. In another embodiment one or more flexible fingers 37 may be disposed along the outer diameter of the frame. A flexible finger comprises a slender portion of the frame cut from the outer edge 38 of the frame. (The flexible fingers or indexing bumps may be formed as an integral part of the frame.) An indexing bump 36 disposed on the end of the flexible finger may further aid in securing the frame to various devices of interest. In another embodiment one or more springs may be operably attached to each of the indexing bumps or flexible fingers to provide a radially outward force that urges the indexing bumps or flexible fingers into corresponding notches disposed in the device in which the frame is disposed. In yet another embodiment the frame may be provided with shaped inserts or notches to accommodate indexing bumps or flexible fingers provided to the device of interest. In this embodiment the indexing bumps or flexible fingers in the device fit into the notches in the frame. In addition, a combination of fingers, indexing bumps and notches may be provided to the frame or device of interest. (The indexing bumps, flexible fingers and notches comprise a means for holding a support device, such as the housing of FIG. 1 or the frame assembly of FIG. 5.)

FIG. 6 shows an embodiment of the frame assembly 30 disposed within a wafer positioner 44 that is itself disposed over an inspection table 45. Disposed within the inspection table is an inspection window 46, through which various failure analysis techniques may be performed. (The wafer is not shown in the frame assembly of FIG. 6 in order to show the inspection window, though the wafer would rest on the wafer platform 32 of the frame assembly.) The frame assembly is provided with two notches 47 and a guide finger or pin 48, which is optionally flexible. Indexing bumps 36 disposed within the positioner 44 fit within the notches in the frame and the guide finger is disposed within a corresponding shaped hole in the frame, thereby securing the frame assembly in a particular orientation within the positioner.

When in use, the wafer positioner moves across the table. Thus, the positioner is capable of positioning any portion of the surface of the wafer over the inspection window. Eventually, the entire surface of the wafer may be inspected. In another embodiment the wafer positioner is fixed and the table and inspection window move along the surface of the wafer.

FIG. 7 shows a cross section of an embodiment of the frame assembly 30 disposed over an inspection table 45. A plurality of integrated circuit chips 15 are disposed on the front side of the wafer 7. The outer diameter 33 of the platform is attached to the frame 31 with an adhesive layer 34 that does not extend under the wafer. Thus, the wafer rests freely on the inner diameter 35 of the wafer platform. The frame assembly is provided with one or more indexing bumps 36 which fit within one or more notches 47 provided in the wafer positioner 44.

The inspection window may be raised slightly above the level of the table a distance, represented by arrows 49, equal to the thickness of the wafer platform. Thus, the inspection window provides additional support to the wafer at the location where the wafer is probed (if a force is applied to the wafer). If the adhesive layer 34 extends under the wafer, then the inspection window may be raised an additional amount equal to the thickness of the adhesive layer. In other embodiments the inspection window may be raised or lowered so that the inspection windowpane supports the wafer if physical force is applied to the wafer.

In another embodiment the frame assembly of FIGS. 5 through 7 may be disposed as a whole within the wafer support assembly of FIGS. 1 through 4. In this case, the inspection windowpane may be disposed, sized and dimensioned so that the wafer rests flush against the inspection windowpane. For example, the inspection window, windowpane or housing may be provided with holes, grooves, fingers, notches, indexing bumps, channels or flanges to accommodate the frame assembly of FIG. 5. In addition, the upper seal may be sized and dimensioned to accommodate the shape of the frame assembly and the wafer. In other embodiments, the inspection window is not used and the frame is disposed directly onto the lower shelf. In either case, the upper seal extends over the frame assembly and wafer. A vacuum is then applied to secure the frame assembly and wafer within the housing.

In use, a wafer may be disposed within the frame assembly of FIG. 5 and the frame assembly may be secured within a wafer positioner. The wafer positioner then moves the frame assembly and wafer across an inspection window (disposed in an inspection table) so that the surface of the wafer may be inspected. In the case of backside emission microscopy, a microscope is disposed beneath the inspection windowpane and a probe card is disposed above the wafer. After inspection, the frame may be detached from the wafer positioner and provided to another machine designed to perform additional failure analysis techniques, or the frame assembly and wafer may be provided to other devices used during other wafer or chip manufacturing processes. For example, the frame assembly of FIG. 5 may be provided to a means for dissecting integrated circuits (such as a focused ion beam device, a milling machine or other devices suitable for dissecting and analyzing circuits), a means for repairing circuits (such as a focused ion beam deposition device, a soldering device or other devices suitable for repairing circuits), or a means for performing polishing, grinding, planarizing, or other processing techniques.

With respect to the support device of FIGS. 1 through 4, an inspection windowpane and wafer is provided on the lower shelf of the housing. An upper seal is provided above the inspection windowpane and the wafer. A vacuum is then provided between the inspection windowpane and the upper seal, thus drawing the upper seal onto the wafer and inspection windowpane and also securing the wafer and inspection windowpane. A probe card may be moved across the surface of the wafer and a microscope may be moved in tandem across the backside of the inspection windowpane. After inspection, the housing, inspection windowpane and wafer may be provided to another machine designed to perform additional failure analysis techniques, or the housing and wafer may be provided to other devices used during other wafer or chip manufacturing processes. For example, the housing of FIG. 1 may be provided to a means for dissecting integrated circuits disposed on the wafer, a means for repairing circuits disposed on the wafer or a means for performing polishing, grinding, planarizing, or other processing techniques. In yet other embodiments the frame of FIG. 1 may be supported by the housing of FIG. 5, and the entire assembly moved to any of the above wafer or circuit processing devices.

The upper seal 2 comprises an annular washer, disk, plate or ring comprised of a resilient material. In other embodiments the outer diameter of the upper seal may be non-resilient. The upper seal may also comprise a solid plate for some applications and may be transparent to selected wavelengths to light. The inspection windowpane 3 may comprise a disk, plate, chuck or washer comprising a non-resilient material that is transparent to selected wavelengths of light. In other embodiments the inspection window or windowpane may instead comprise any support plate, disk or chuck (opaque or transparent) that is suitable for supporting a wafer during other wafer processing techniques.

The wafer housing, inspection windowpane and seals of FIG. 1 may comprise any suitable substance. For example, the wafer housing may comprise fiberglass, metal or other non-resilient material. The seals may comprise rubber, latex, or other elastomeric material and may have a variety of shapes. The inspection windowpane may comprise quartz, sapphire, glass (such as BK7 glass) or other rigid, transparent materials.

In addition, the wafer frame, wafer platform and adhesive of FIG. 5 may comprise any suitable substance. For example, the wafer frame may comprise fiberglass, metal or other non-resilient material. In another embodiment, the wafer frame may be slightly flexible in order to make it easier to transfer the frame from machine to machine or to apply bending stress to the wafer for strength evaluation. The wafer platform may comprise Mylar™, latex or other material suitable for holding a wafer.

The housing or the wafer frame may be sized and dimensioned to fit in any device used in the process of creating or refining semiconductor wafers or integrated circuit chips. For example, the housing or frame may be provided with a break or opening such that a portion of the wafer's edge is exposed. In other words, the housing or frame shown in the Figures may be "C" shaped instead of circular or elliptical as shown. Such a housing or frame may facilitate ease of use within existing wafer processing machines. Though illustrated in circular embodiments, the wafer support assembly may be formed to match wafers that are cut or trimmed to other shapes. Though illustrated in the context of wafers with integrated circuits built up upon them, the supporting assembly and method can be used with other work pieces as well. Thus, while the preferred embodiments of the devices and methods have been described in reference to the environment in which they were developed, they are merely illustrative of the principles of the inventions. Other embodiments and configurations may be devised without departing from the spirit of the inventions and the scope of the appended claims.

I claim:

1. A device for supporting thin wafers, said device comprising:

a housing comprising an annular frame having an upper shelf extending radially inwardly from the frame and a lower shelf extending radially inwardly from the upper shelf;

an inspection windowpane disposed on the lower shelf;

an upper seal comprising a resilient ring, said upper seal sized to fit on the upper shelf, said resilient ring having a flange extending radially inwardly over the inspection windowpane;

a channel disposed within the housing, said channel providing fluid communication between the exterior of the housing and the interior of the housing;

wherein a vacuum communicated to the channel creates a sealed space between the housing, upper seal and the windowpane.

2. The device of claim 1 further comprising a ring seal disposed on the upper surface of the lower shelf, beneath the inspection windowpane.

3. The device of claim 1 wherein the inspection windowpane is provided with one or more openings suitable to receive a probe used during failure analysis.

4. A device for holding a wafer comprising an annular frame having an annular space in the inner diameter of the frame, said space being sized and dimensioned to receive the outer perimeter of a wafer, and a means for applying vacuum to the space, wherein at least a portion of the annular frame is resilient such that application of vacuum to the space causes the portion of the annular frame to be drawn toward the perimeter of the wafer.

\* \* \* \* \*